United States Patent [19]

Ariizumi et al.

[11] Patent Number: 4,558,343

[45] Date of Patent: Dec. 10, 1985

[54] SEMICONDUCTOR DEVICE HAVING A HIGH RESISTIVITY LAYER IN DIRECT CONTACT WITH A POLYCRYSTALLINE SILICON LAYER OF HIGH IMPURITY CONCENTRATION

[75] Inventors: Syoji Ariizumi, Tokyo; Yasushi Fukatsu; Fujio Masuoka, both of Yokohama, all of Japan

[73] Assignee: Tokyo Shibaura Denki Kabushiki Kaisha, Kawasaki, Japan

[21] Appl. No.: 665,081

[22] Filed: Oct. 26, 1984

Related U.S. Application Data

[63] Continuation of Ser. No. 438,580, Nov. 2, 1982, abandoned, which is a continuation of Ser. No. 121,451, Feb. 14, 1980, abandoned.

[30] Foreign Application Priority Data

Feb. 20, 1979 [JP] Japan .................................. 54-18734
Jun. 27, 1979 [JP] Japan .................................. 54-81126
Nov. 30, 1979 [JP] Japan .................................. 54-155410

[51] Int. Cl.[4] .................... H01L 27/02; H01L 29/34; H01L 29/04
[52] U.S. Cl. ........................................ 357/51; 357/41; 357/54; 357/59
[58] Field of Search ................. 357/51, 54, 59, 41

[56] References Cited

U.S. PATENT DOCUMENTS

| | | | |
|---|---|---|---|
| 3,519,901 | 7/1970 | Bean et al. ............................ | 357/51 |
| 4,110,776 | 8/1978 | Rao et al. ............................. | 357/59 |
| 4,146,902 | 3/1979 | Tanimoto et al. ..................... | 357/59 |
| 4,209,716 | 6/1980 | Raymond, Jr. ........................ | 357/59 |
| 4,246,593 | 1/1981 | Bartlett ................................ | 357/59 |
| 4,270,137 | 5/1981 | Coe ...................................... | 357/59 |
| 4,322,824 | 3/1982 | Allan .................................... | 357/59 |

OTHER PUBLICATIONS

"Two Static 4K Clocked and Nonclocked RAM Designs", T. R. O'Connell et al., IEEE J. Solid-State Circuits, vol. SC-12, No. 5, pp. 497–501, Oct. 1977.

*Primary Examiner*—Gene M. Munson
*Attorney, Agent, or Firm*—Finnegan, Henderson, Farabow, Garrett & Dunner

[57] ABSTRACT

This invention provides a semiconductor device, which has a high impurity concentration diffusion region such as a drain diffusion region and a resistor comprising a polycrystalline silicon layer (which may be a load of a driver MOS transistor), and in which part of the resistor is in direct contact with the high impurity concentration diffusion region. This invention also provides a method of manufacturing a semiconductor device, which comprises the steps of forming a gate electrode and drain and source diffusion regions along the principal surface of a semiconductor substrate, then forming a polycrystalline silicon resistor layer of a comparatively low impurity concentration such that it is in direct contact with a diffusion region, and subsequently causing impurity diffusion from the diffusion region through thermal treatment to obtain ohmic contact between the diffusion region and resistor layer.

6 Claims, 21 Drawing Figures

SEMICONDUCTOR DEVICE HAVING A HIGH RESISTIVITY LAYER IN DIRECT CONTACT WITH A POLYCRYSTALLINE SILICON LAYER OF HIGH IMPURITY CONCENTRATION

This application is a continuation of application Ser. No. 438,580, filed Nov. 2, 1982, now abandoned, which is a continuation of application Ser. No. 121,451, filed Feb. 14, 1980, for Semiconductor Device and Method of Manufacturing the Same, now abandoned.

BACKGROUND OF THE INVENTION

This invention relates to a semiconductor device having a resistive layer of high resistivity and a method of manufacturing the same.

Hitherto, inverter circuits and reference voltage generating circuits, in which a load element consisting of a MOS (metal oxide semicondustor) transistor is connected to a driver MOS transistor, have been used.

Figure 1:
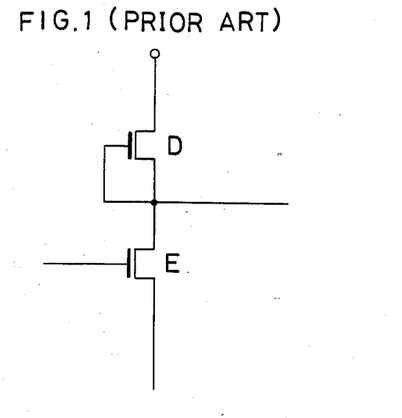
FIG. 1 is a circuit diagram showing a prior-art inverter circuit.

However, where a so-called E/D inverter circuit using a MOS transistor as a load element is formed as shown in FIG. 1, the mutual conductance of the MOS transistor is comparatively high, so that an attempt to reduce the mutual conductance for reducing the power consumption of the MOS integrated circuit invites increase of the channel length of the MOS transistor used as load element, which is undesired from the standpoint of achieving high density of integration.

Figure 2:
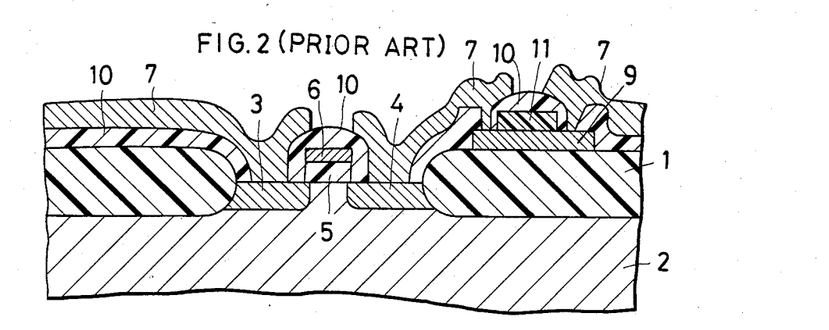
FIG. 2 is a sectional view showing a semiconductor device constituting a prior-art inverter circuit, wherein a resistor having a high resistivity is employed.
Figure 3:
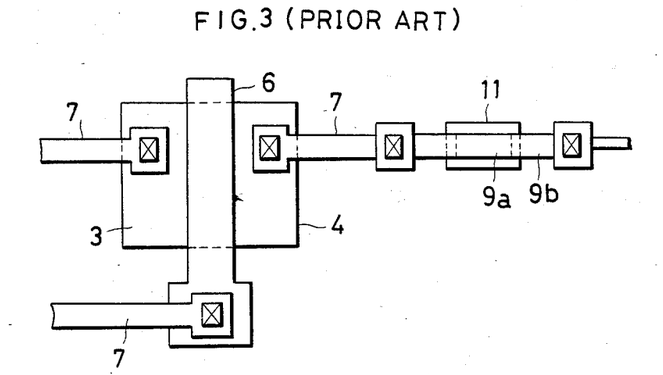
FIG. 3 is a plan view of the semiconductor device shown in FIG. 2 viewed from the side of the principal surface thereof.
Figure 4:
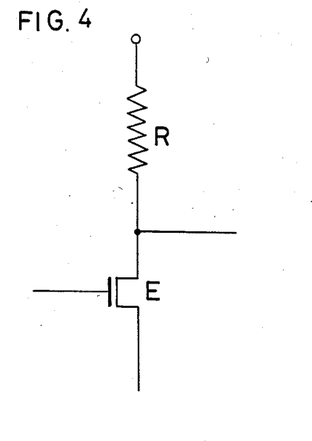
FIG. 4 is a circuit diagram showing an inverter circuit using a resistive element of high resistivity.

In order to solve this problem, it has been contemplated to form an inverter circuit as shown in FIGS. 2 and 3, wherein a driver MOS transistor comprises source and drain diffusion regions 3 and 4 formed in and contiguous to the principal surface of a semiconductor substrate 2 provided with a field oxide film 1, a gate electron 6 consisting of polycrystalline silicon formed over the exposed surface of the substrate between both the diffusion regions 3 and 4 via a gate oxide film 5 and a lead metal 7 formed to lead from both the diffusion regions 3 and 4, wherein a high resistivity layer 9 of polycrystalline silicon or the like serving as a load resistor element is formed on the field oxide film 1, by separating this layer 9 into high and low resistive sections 9a and 9b after selective thermal impurity diffusion using a mask layer 11 (which may be formed by vapor growing and photoetching a low temperature oxidation film), subsequently forming a protective layer 10 to cover the wafer except for current take-out electrode portions and connecting an electrode portion of the load resistor and the drain diffusion region 4 with a metal lead, thus constructing an inverter circuit as shown in FIG. 4.

This inverter circuit, which is constituted by a semiconductor device having a load resistor consisting of a high resistivity layer, can be extremely reduced in size as compared to one using a MOS transistor as load element. However, even with this circuit sufficiently high density integration cannot be achieved. This is because of the fact that for a given length dimension of the high resistivity section 9a an extra length should be provided for the mask layer 11 for the high resistivity section 9a by taking into considerations the possibility of impurity diffusing into the masked portion (about 10μ) at the time of the selective thermal impurity diffusion so that the intended length of its high resistivity is secured.

In addition, the inverter circuit or the like which is produced in the above method is subject to great fluctuations of the resistance of the load resistor.

SUMMARY OF THE INVENTION

This invention is intended, in the light of the aforementioned aspects, to provide a semiconductor device, which features high density of integration and improved electric characteristics, and also a method of manufacturing a semiconductor device, with which the impurity diffusion step and hence masking operation for separating the high resistivity element into a high resistivity portion and a low resistivity portion are dispensed with so that it can simplify the manufacturing step.

More particularly, according to this invention there is provided a semiconductor device, in which a high resistivity element comprising a polycrystalline silicon layer is directly contacted with a high impurity concentration diffusion region formed in a semiconductor substrate (for instance drain or source diffusion region) or with a low resistivity polycrystalline silicon layer.

Further, according to this invention there is provided a semiconductor device, in which a high impurity concentration diffusion region (such as source or drain diffusion region) or a low resistivity polycrystalline silicon layer formed in a semiconductor substrate and a high resistivity element comprising polycrystalline silicon layer are in direct contact with each other, and also in which the high resistivity element at least partly extends over a gate electrode formed on the semiconductor substrate.

Furthermore, according to this invention there is provided a method of manufacturing a semiconductor device, which comprises a step of forming an insulating layer on the principal surface of a semiconductor substrate at a predetermined position, a step of forming a gate electrode on the insulating layer, a step of forming a diffusion region in and contiguous to the principal surface of the semiconductor substrate, a step of forming a resistive element comprising a polycrystalline silicon layer of an impurity concentration lower than that of the diffusion region such that the resistive element is in direct contact with the diffusion region, and a step of causing impurity diffusion from the diffusion region into the polycrystalline silicon layer through thermal treatment to obtain ohmic contact between the polycrystalline silicon layer and the diffusion region.

Still further, this invention provides a method of manufacturing a semiconductor device, which comprises a step of forming an insulating layer on the principal surface of a semiconductor substrate at a predetermined position, a step of forming a gate electrode and also a first polycrystalline silicon layer on the insulating layer, a step of forming a diffusion region in and contiguous to the principal surface of the semiconductor substrate, a step of forming a resistive element comprising a second polycrystalline silicon layer having an impurity concentration lower than that of the first polycrystalline silicon layer such that the second polycrystalline silicon layer is in direct contact at least partially with the first polycrystalline silicon layer, and a step of causing impurity diffusion from the first polycrystalline silicon layer into the second polycrystalline silicon layer through thermal treatment to obtain ohmic contact between the first and second polycrystalline silicon layers.

DETAILED DESCRIPTION OF THE PREFERRED EMBODIMENTS

The semiconductor device according to the invention has the following features.

1. It has a high resistivitiy layer comprising polycrystalline silicon.

2. The high resistivity layer comprising polycrystalline silicon layer is at least partially directly contacted with a polycrystalline silicon layer different from that of the former polysilicon layer and having a higher impurity concentration than that of the high resistive layer, or with a diffusion region formed in a semiconductor substrate.

3. In a more preferred form, the high resistivity layer at least partly extends over a gate electrode formed on the semiconductor substrate.

Throughout the specification, by the term "direct contact" is meant contact of the polycrystalline silicon layer constituting the high resistivity element and having a "substantially uniform impurity concentration maintained therein" with a high impurity concentration region, for instance source or drain diffusion region or with a high impurity concentration polycrystalline silicon layer, without any intervening layer.

Throughout the specificaion, by the term "different polycrystalline silicon layer" is meant a difference in the patterning step of these polycrystalline silicon layers.

"The contact with a substantially uniform impurity concentration" is achieved by causing diffusion of impurity contained in, for instance, the drain diffusion region, into the high resistivity polycrystalline silicon layer to obtain ohmic contact.

This ohmic contact can be achieved with mere formation of a high impurity concentration region (of a lower impurity concentration than in the drain diffusion region) extending a distance of only a fraction of a micron, and by so doing substantially a uniform impurity concentration (including a case where the impurity is substantially zero) can be maintained over the entire area of the high resistivity polycrystalline silicon layer.

In contrast, in case when ohmic contact between the high resistivity polycrystalline silicon layer and drain diffusion region is produced by forming a new high impurity concentration region, for instance by using the C.V.D. silicon oxide as a mask, a high impurity concentration region about several microns in distance and having a higher impurity concentration than that of the high resistivity polycrystalline silicon layer will be formed. In this case, therefore, substantially a uniform impurity concentration cannot be obtained over the entire area of the high resistivity polycrystalline silicon layer.

The invention will now be described in conjunction with some preferred embodiments thereof with reference to the accompanying drawings.

Figure 5A:
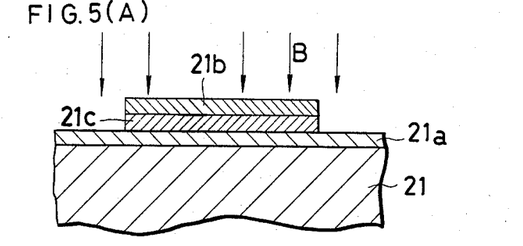
FIGS. 5A to 5E are sectional views illustrating an embodiment of the method of manufacturing a semiconductor device according to the invention.
Figure 5B:
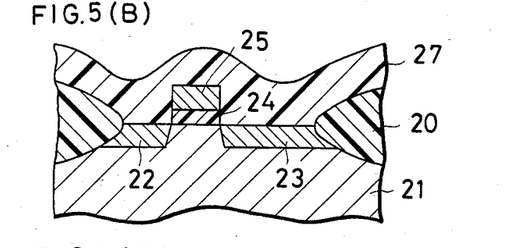
Figure 5C:
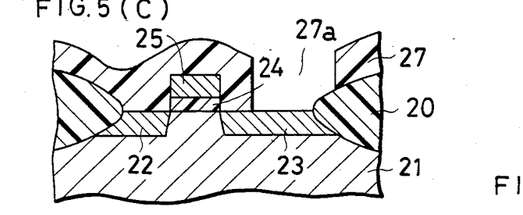
Figure 5D:
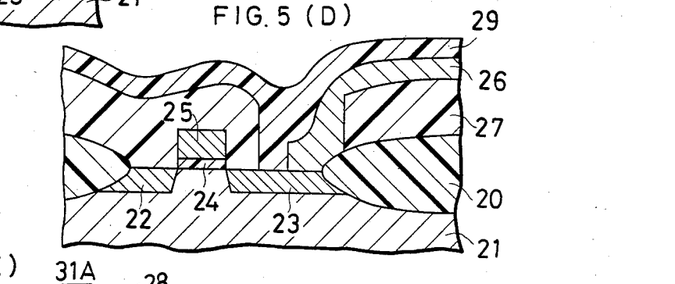
Figure 5E:
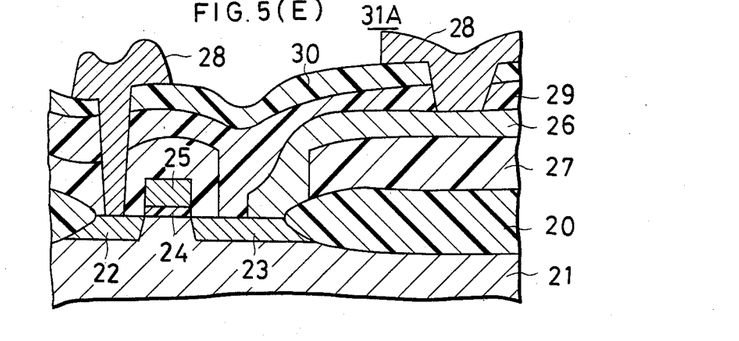
Figure 6:
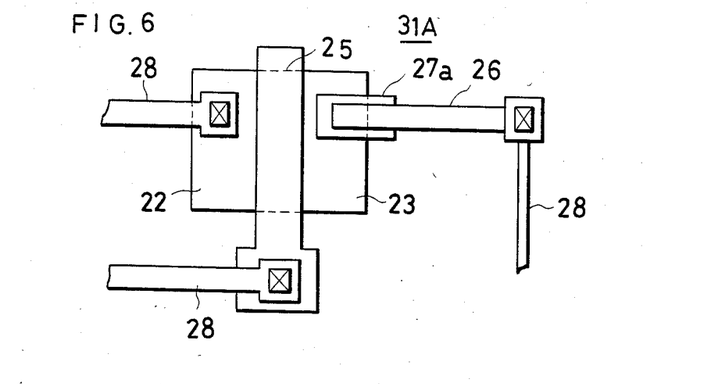
FIG. 6 is a plan view showing the semiconductor device shown in FIG. 5E.

FIGS. 5E and 6 show an embodiment of the semiconductor device according to the invention. The illustrated semiconductor device 31A comprises a semiconductor substrate 21, a field oxide film 20 formed thereon and source and drain diffusion regions 22 and 23 formed in the substrate 21 and extending along the principal surface thereof (the source diffusion region having an impurity concentration of, for instance, $10^{19}$ to $10^{21}$ atoms/cm$^3$ and the drain diffusion region having an impurity concentration of, for instance, $10^{19}$ to $10^{21}$ atoms/cm$^3$).

Over the exposed surface of the substrate between the source and drain diffusion regions 22 and 23 is formed via a gate oxide film 24 a gate electrode 25 having an impurity concentration of, for instance, $10^{19}$ to $10^{21}$ atoms/cm$^3$. Over the surface of the field oxide film 20 is formed via an insulating layer 27 a high resistivity layer 26 (with a specific resistivity of, for instance, $10^6$ to $10^{11}$ Ω/□), which has an end portion directly contacted with the drain diffusion region 23.

A silicon oxide film 29 is formed on the surface of the insulating layer 27 covering the gate electrode 25 and also on the surface of the high resistivity layer 26 except for portions where a lead metal 28 is formed, and a protective film 30 is formed on the silicon oxide film 29.

It will be seen that this semiconductor device 31A includes the high resistivity layer 26 having an end portion in direct contact with the drain diffusion region 23 of the driver MOS transistor and forms a so-called inverter circuit.

This semiconductor device 31A may be produced through steps shown in FIGS. 5A to 5E.

In the first place, an oxide film 21a contiguous to the principal surface of the semiconductor substrate 21, which is, for instance, a P-type semiconductor with a resistivity of 20 Ω·cm, is formed by high temperature oxidation. Then, a silicon nitride film 21c having a desired pattern is formed atop the oxide film 21a by using as mask a photo-resist 21b. Subsequently, after making an inversion prevention treatment on the semiconductor substrate 21 by boron ion implantation under conditions of an acceleration voltage of 120 kV and a dose quantity of $2 \times 10^{13}$ ions/cm$^2$ using the silicon nitride film 21c with the photo-resist 21b thereatop as mask, a field oxide film 20 with a thickness of about 1μ is formed by high temperature. Thereafter, the silicon nitride film 21c and the oxide film 21a thereunder are removed, and then the gate oxide film 24 with a thickness of 400 to 1,000 Å is formed by high temperature oxidation. Then, boron is implanted into the semiconductor substrate 21 covered with the gate oxide film 24 under conditions of an acceleration voltage of about 50 kV and a dose quantity of $3 \times 10^{11}$ ions/cm$^2$ for setting a threshold voltage. Then, the gate electrode 25 which has a desired pattern is formed by vapor growing and appropriately photo-engraving a polycrystalline silicon layer. Afterwards, the source and drain diffusion regions 22 and 23 are formed by diffusing phosphorus or arsenic with the gate electrode 25 used as mask, followed by vapor growth formation of the silicon oxide film 27 atop the wafer to obtain a driver MOS transistor, as shown in FIG. 5B.

Then, a contact hole 27a is formed in the silicon oxide film 27 in the driver MOS transistor to expose part of the drain diffusion region 23, as shown in FIG. 5C.

Thereafter, a high resistivity layer free from impurity is formed, for instance by vapor growth method, atop the wafer having the contact hole 27a, and is then converted to one having a predetermined high resistivity (of the order of $10^6$ to $10^{11}$ $\Omega/\square$) by phosphorus ion implantation, for instance under conditions of an acceleration voltage of about 50 kV and a dose quantity of $1 \times 10^{13}$ to $1 \times 10^{14}$ ions/cm$^2$. The high resistivity layer 26 with the resistivity thereof set in the above way is then photo-engraved into a pattern as shown in FIG. 5D, and then the silicon oxide film 29 is formed by the vapor growth method.

Then, after giving a stabilization treatment to the silicon oxide film 29 for stabilizing the semiconductor device, the protective film 30 of phosphorated silicate glass (P.S.G.) and having a thickness of about 5,000 Å is formed to cover the film 29, and contact holes penetrating the protective film 30 are formed by the photo-engraving method to expose part of the high resistivity layer 26 and the source diffusion region 22. Finally, the lead metal 28 which may be aluminum or the like is formed to complete the semiconductor device 31A as shown in FIG. 5E.

With this semiconductive device 31A an end portion of the high resistivity layer 26 is in direct contact with the drain diffusion region 23 in the MOS transistor, and this contact can be realized by causing impurity diffusion from the drain diffusion region 23 into the high resistivity layer 26 after the formation of these two, for instance in a step of thermally treating the silicon oxide film 29, so that it is possible to simplify manufacturing step and improve productivity.

In addition, since the high resistivity layer 26 is formed such that its end portion is in direct contact with the already formed high impurity concentration region (e.g., drain diffusion region 23), no step for separating high and low resistivity portions is needed, and it is possible to readily form the high resisitivity layer 26 having a predetermined resistivity while preventing the impurity diffusion that is undesired from the standpoint of increasing the density of integration. Thus, it is possible to increase the accuracy of design of the semiconductor device 31A and increase the density of integration, as well as improving the electric characteristics.

Figure 7A:
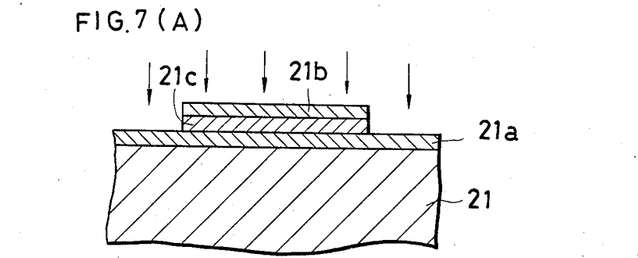
FIGS. 7A to 7E are sectional views illustrating another embodiment of the method of manufacturing a semiconductor device according to the invention.
Figure 7B:
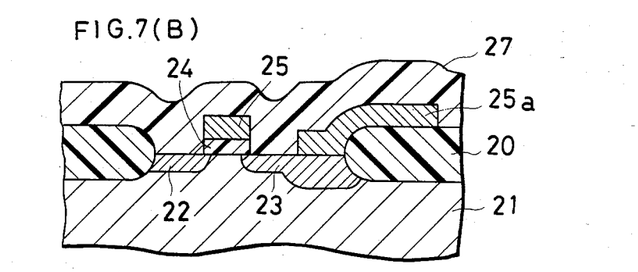
Figure 7C:
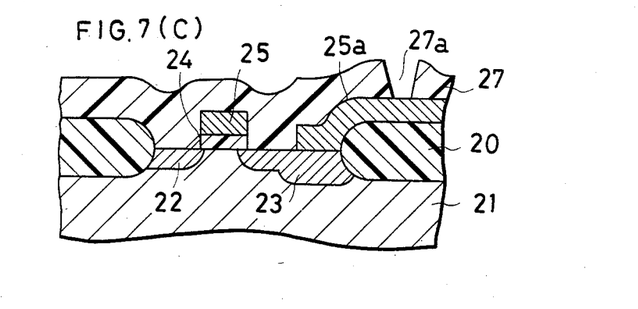
Figure 7D:
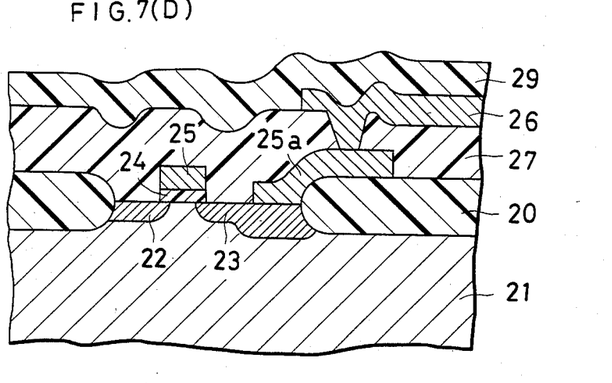
Figure 7E:
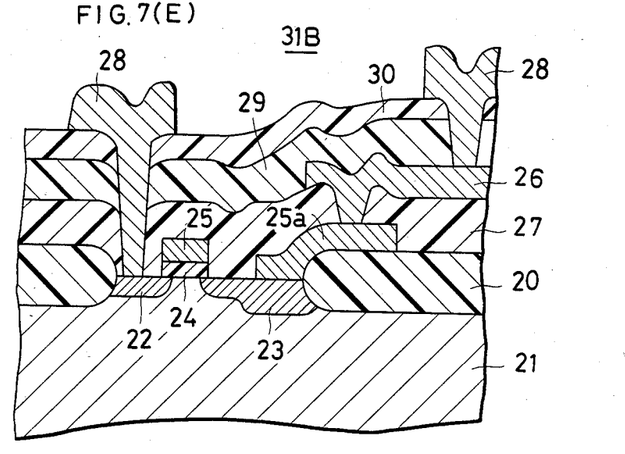
Figure 8:
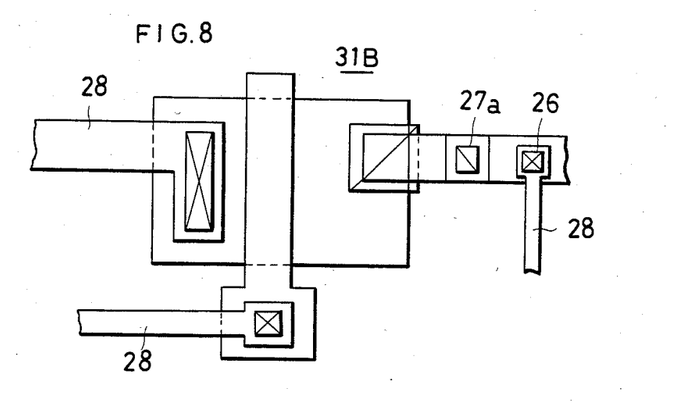
FIG. 8 is a plan view showing the semiconductor device shown in FIG. 7E.

FIGS. 7E and 8 show another embodiment of the invention. This semiconductor device, generally designated at 31B, has a source diffusion region 22 having an impurity concentration of, for instance, $10^{19}$ to $10^{21}$ atoms/cm$^3$ and a drain diffusion region 23 having an impurity concentration of, for instance, $10^{19}$ to $10^{21}$ atoms/cm$^3$, these regions being contiguous to the principal surface of a semiconductor substrate 21 provided with a field oxide film 20.

Over the exposed surface of the substrate between the source and drain diffusion regions 22 and 23 is formed via a gate oxide film 24 a gate electrode 25 comprising high impurity concentration polycrystalline silicon having an impurity concentration of, for instance, $10^{19}$ to $10^{21}$ atoms/cm$^3$. A polycrystalline silicon layer 25a having a high impurity concentration (hereinafter referred to as first polycrystalline silicon layer) is formed on the field oxide film 20 such that its end portion is contacted to the drain diffusion region 23. Formed over the first polycrystalline silicon layer 25a via an insulating layer 27 is a high resistivity layer of polycrystalline silicon (having a resistivity of the order of $10^6$ to $10^{11}$ $\Omega/\square$). A silicon oxide film 29 and a protective film 30 are formed in the mentioned order on the high resistivity layer 26 and also on the surface of the insulating layer 27. Contact holes which are formed to expose part of the high resistivity layer 26 and part of the source diffusion region 22 are filled with a lead metal 28.

It will be seen that this semiconductor device 31B includes the high resistivity layer 26 having a portion in direct contact with the first polycrystalline silicon layer 25a which is in turn in contact with the drain diffusion region 23 of the driver MOS transistor, and thus it forms a so-called inverter circuit.

This semiconductor device 31B may be produced through steps shown in FIGS. 7A to 7E. This example of manufacture is the same as that shown in FIGS. 5A to 5E except for that the first polycrystalline silicon layer 25a is formed concurrently with the formation of the gate electrode 25 and that the contact hole 27a is formed to expose the polycrystalline silicon layer 25a, so that like parts are designated by like reference numeral adopted for FIGS. 5A to 5E.

In the example of FIGS. 7A to 7E, oxide film 21a contiguous to the principal surface of the P-type semiconductor substrate 21 and also photo-resist 21b and silicon nitride film 21c are first formed, as shown in FIG. 7A. Then, ion implantation step is made for preventing the inversion of the semiconductor substrate 21. Subsequently, the field oxide layer 20 with a thickness of about 1$\mu$ is formed, and also an oxide layer for the gate oxide film 24 with a thickness of 400 to 1,000 Å is formed by high temperature oxidation, as shown in FIG. 7B. Then, after finishing boron ion implantation for setting a threshold voltage, a hole for contacting the first polycrystalline silicon layer 25a with the drain diffusion region 23 is formed and the gate electrode 25 and the first polycrystalline silicon layer 25a are formed, for instance, by vapor growing and photo-engraving a polycrystalline silicon layer. In this occasion a phosphor diffusion is carried out on the entire surface of the first polysilicon before patterning the first polysilicon layer. Thereafter, the source and drain diffusion regions 22 and 23 are formed by diffusing phosphorus or the like. At this step, the first polycrystalline silicon layer 25a is connected to the drain diffusion layer 23 by well-known techniques concerning the buried contact between polycrystalline silicon and substrate silicon. Afterwards, the silicon oxide film 27 is formed by vapor growth method on the wafer to obtain a driver MOS transistor.

Subsequently, the contact hole 27a is formed to expose the first polycrystalline silicon layer 25a of high impurity concentration, as shown in FIG. 7C. Then, the high resistivity layer 26 having a high resistivity (of $10^{11}$ to $10^6$ $\Omega/\square$) is formed by vapor growing a high resistivity layer free from impurity and implanting phosphorus ions or the like, as shown in FIG. 7D. Then, after patterning the layer 26 the silicon oxide film 29 is formed by the vapor growth method.

Then, after stabilizing the silicon oxide film 29, the protective film 30 with a thickness of about 5,000 Å is formed to cover the film 29, and also contact holes are formed to expose part of the low impurity concentration layer 26 and also part of the source diffusion region 22. Finally, the lead metal layer 28 of aluminum or the like is formed to obtain the semiconductor device 31B shown in FIG. 7E.

Since this semiconductor device 31B has the high resistivity layer 26 which is connected to the drain diffusion region 23 of the driver MOS transistor via the first polycrystalline silicon layer 25a, like the semiconductor device 31A of the preceding embodiment it is possible to dispense with the diffusion step for simplifying the manufacturing step and improving the productivity.

In addition, since the direct contact between the high resistivity layer 26 and first polycrystalline silicon layer 25a is obtained, no step of separating high and low resistivity portions is needed, and it is possible to readily form the high resistivity layer 26 having a predetermined resistivity. Thus, it is possible to increase the design accuracy of the semiconductor device 31B and improve the density of integration and electric characteristics.

Now, the invention will be described in connection with an example, in which a high resistivity layer at least partly extends over the gate electrode formed on the semiconductor substrate.

Figure 9:
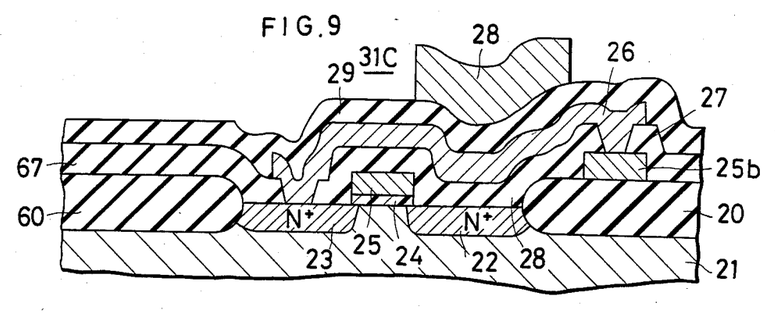
FIGS. 9 and 10A are sectional views showing other embodiments of the semiconductor device according to the invention.

FIG. 9 shows such an example. This semiconductor device, generally designated at 31C, forms an inverter circuit as shown in FIG. 4. It has a source diffusion region 22 having an impurity concentration of, for instance, $10^{19}$ to $10^{21}$ atoms/cm$^3$ and a drain diffusion region 23 having an impurity concentration of, for instance, $10^{19}$ to $10^{21}$ atoms/cm$^3$, these regions being formed in and contiguous to the principal surface of a semiconductor substrate 21 provided with a field oxide film 20 and spaced apart a predetermined distance from each other.

Over the exposed surface of the substrate between the source and drain diffusion regions 22 and 23 is formed via a gate oxide film 24 a gate electrode 25 constituting a gate portion of the MOS transistor.

Formed on the field oxide film 20 is a first polycrystalline silicon layer 25b, which constitutes a power source portion of the inverter circuit. The first polycrystalline silicon layer 25b and gate electrode 25 are covered with an insulating layer 27.

A second polycrystalline silicon layer 26 having a higher resistivity than that of the first polycrystalline silicon layer 25b is formed such that its end portion is in direct contact with the first layer 25b. The second polycrystalline silicon layer 26 partly extends over the gate electrode 25 and has its other end portion in direct contact with the drain diffusion region 23, and it constitutes a resistive portion of the inverter circuit.

On the second polycrystalline silicon layer 26 and also on the insulating layer 27 formed on the field oxide film 20, there is deposited a silicon oxide film 29. Formed on the silicon oxide film 29 is a current take-out electrode 28 consisted of aluminum, which is connected to the source diffusion region 22 or drain diffusion region 23 and constitutes a source or drain current take-out electrode of the inverter circuit.

It will be seen that with the semiconductor device 31C of this embodiment, in which the highly resistive second polycrystalline silicon layer 26 which constitutes the resistive portion of the inverter circuit extends over the gate electrode 25, it is possible to extremely reduce the space factor of the resistive portion in practice and increase the density of integration.

In addition, since at least one portion of the second polycrystalline silicon layer 26, constituting the high resistive portion, is in direct contact with a high impurity concentration diffusion region (for instance drain diffusion region 23) which is previously formed, no step of separating high and low resistivity portions is required in manufacturing step. Consequently, it is possible to readily form a high resistivity portion having a desired resistivity while preventing the impurity diffusion that is undesired from the standpoint of increasing the density of integration. Thus, it is possible to increase the accuracy of design of the semiconductor device 31C and increase the density of integration.

Figure 10A:
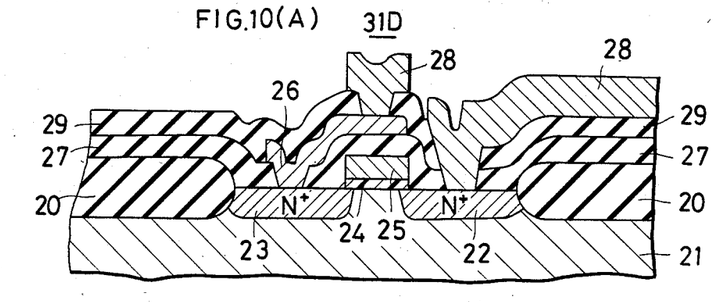
Figure 10B:
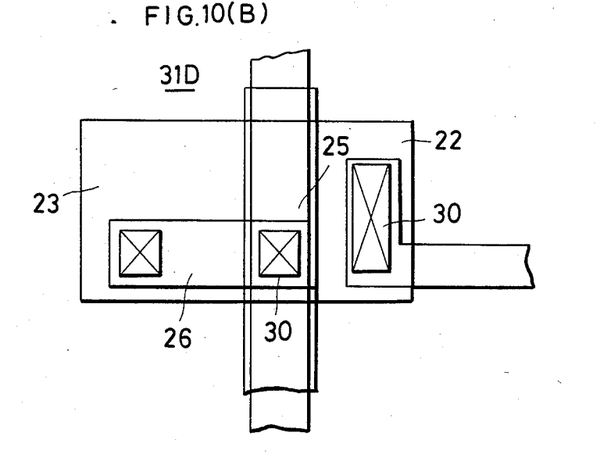
FIG. 10B is a plan view showing the semiconductor device shown in FIG. 10A.

While in the semiconductor device 31C of the preceding embodiment the high resistivity portion is in direct contact at one end portion with the drain diffusion region 23, strides the gate electrode 25 of the driver MOS transistor and is in direct contact at the other end with the first polycrystalline silicon layer 25b, various modifications are conceivable. For instance, in a semiconductor device 31D shown in FIGS. 10A and 10B, a second polycrystalline silicon layer 26, constituting the high resistivity portion, is in contact at one end portion with a high impurity concentration diffusion region (for instance drain diffusion region 23) and has the other end portion located over the gate electrode 25, and a take-out electrode 28 is provided on the afore-mentioned other end portion.

Figure 11:
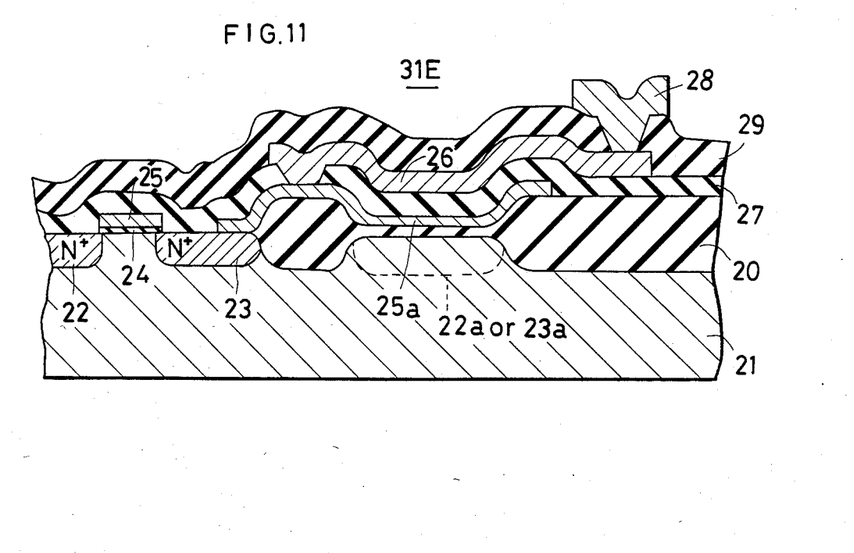
FIGS. 11 and 12 are sectional views showing further embodiments of the semiconductor device according to the invention.

FIG. 11 shows another modification. In this semiconductor device, generally designated at 31E, which constitutes an inverter circuit, a second polycrystalline silicon layer 26, constituting the high resistivity portion, is in direct contact at one end portion with the first polycrystalline silicon layer 25a which is connected with a drain diffusion region 23 of the MOS transistor and has a portion located over the gate of another transistor, which has source and drain diffusion regions 22a and 23a arranged in a direction at right angles to the direction of arrangement of the source and drain diffusion regions 22 and 23 of the MOS transistor.

Figure 12:
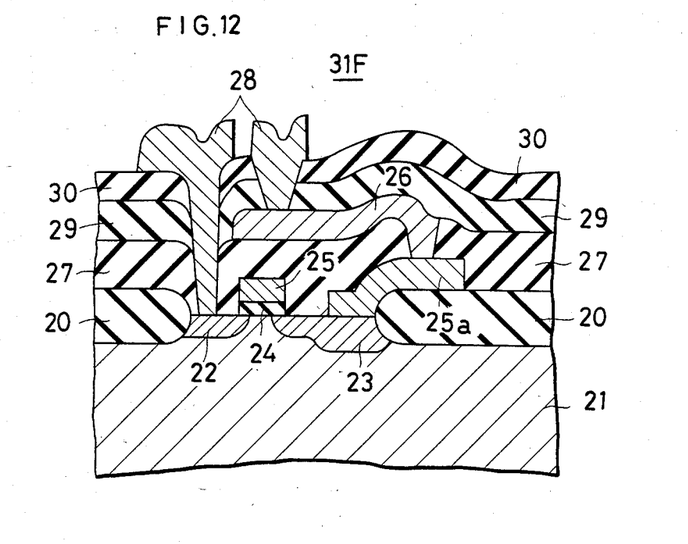

FIG. 12 shows a further embodiment. The semiconductor device, generally designated at 31F, of this embodiment, constitutes an inverter circuit similar to those mentioned above. Source and drain diffusion regions 22 and 23 are formed in a semiconductor substrate 21 provided with a field oxide film 20, and on the exposed surface of the substrate between the source and drain diffusion regions 22 and 23 is formed via a gate oxide film 24 a gate electrode 25 comprising a third polycrystalline silicon having a high impurity concentration.

A first polycrystalline silicon layer 25a having a high impurity concentration is formed such that an end portion of it is contacted with part of the drain diffusion region 23.

The gate electrode 25 and first polycrystalline silicon layer 25a are covered with an insulating layer 27. A second polycrystalline silicon layer 26 having a higher resistivity than those of the first polycrystalline silicon layer 25a and the third polycrystalline silicon 25 is formed such that an end portion of it is in direct contact with the layer 25a. The other end portion of the second polycrystalline silicon layer 26 is formed over the gate electrode 25.

A silicon oxide film 29 and a protective layer 30 are formed in the mentioned order on the insulating layer 27 and also on the second polycrystalline silicon layer 26.

A lead metal 28 is provided to fill contact holes and in contact with the second polycrystalline silicon layer 26 and source diffusion region 22.

With this semiconductor device 31F, in which the second polycrystalline silicon layer 26 constituting the resistive portion of the inverter circuit extends over the gate electrode 25, like the preceding semiconductor devices the space factor of the resistive portion can be extremely reduced in practice to permit increase of the density of integration.

In addition, since an end portion of the second polycrystalline silicon layer 26 constituting the high resistivity portion is in direct contact with the first polycrystalline silicon layer 25a of a high impurity concentration, no step of separating high and low resistivity portions is required in manufacture, and a high resistive portion having a predetermined resistivity can be readily formed. Thus, it is possible to increase the accuracy of design of the semiconductor device 31F and achieve a high density of integration.

The semiconductor devices shown in FIGS. 9 to 12 can be produced substantially in the same manner as described in connection with the FIGS. 5A to 5E and FIGS. 7A to 7E, as is obvious to one skilled in the art, so that their manufacture is not described here. In the semiconductor device according to the invention a high resistivity layer is formed such that it is in direct contact with a diffused region formed in the semiconductor substrate or with a polycrystalline silicon layer of a high impurity concentration, it is possible to achieve a high density of integration of the semiconductor device and improve electric characteristics thereof.

In addition, the fact that the ohmic contact between the high resistivity layer and high impurity concentration diffusion region is obtained by causing diffusion of impurity from the diffusion region through thermal treatment is advantageous from the standpoint of improving the electric characteristics and design precision of the device.

Further, with the method of manufacturing the semiconductor device according to the invention it is possible to dispense with a step of separating high and low resistivity portions, and hence a step using a mask, thus permitting improvement of the operation control property and reduction of the cost of manufacture.

In the above embodiments, this invention is explained in reference with inverter circuits as applied to MOS transistors, but this invention is also applicable to a semiconductor device having a circuit comprising a resistor of a high resistivity, such as reference voltage generating circuits or the like.

What we claim is:

1. In a semiconductor device having a first MOS transistor and a second MOS transistor separated by a field oxide layer from the first MOS transistor, a structure comprising:
    a semiconductor substrate of one conductivity type;
    a high impurity concentration diffusion region formed in the surface of said semiconductor substrate and doped with an impurity of the opposite conductivity type to that of said substrate, said region being the drain diffusion region of said first MOS transistor;
    a first polycrystalline silicon layer doped with an impurity of said opposite conductivity type and extending over said field oxide layer, and one end of which is connected with a portion of said high impurity concentration diffusion region;
    an oxide layer extending over a portion of said first polycrystalline silicon layer;
    a resistor comprising a second polycrystalline silicon layer disposed over either one of the gate electrodes of the first and second MOS transistors, one end of said resistor being in direct contact with said first polycrystalline silicon layer through an opening provided over the field oxide layer through said oxide layer, and impurities being thermally diffused from said first polycrystalline silicon layer into that portion of said second polycrystalline silicon layer which is in contact with said first polycrystalline silicon layer, thereby electrically connecting both the first and second polycrystalline silicon layers; and
    another end portion of said first polycrystalline silicon layer constituting a gate electrode of the gate of said second MOS transistor.

2. The semiconductor device according to claim 1, wherein the impurity concentration of said first polycrystalline silicon layer ranges from $10^{19}$ to $10^{21}$ atoms/cm$^3$, and wherein the resistivity of said resistor ranges from $10^6$ to $10^{11} \Omega/\square$.

3. The semiconductor device according to claim 1, wherein said resistor has a substantially uniform impurity concentration distribution except for said one end thereof.

4. The semiconductor device according to claim 1, wherein the high impurity concentration layer, said resistor and said high impurity concentration diffusion region constitute an inverter circuit.

5. The semiconductor device according to claim 1, wherein said high impurity concentration diffusion region is a drain diffusion region of an MOS transistor and said resistor extends over a gate electrode of said MOS transistor.

6. The semiconductor device according to claim 1, wherein said high impurity concentration diffusion region is a drain diffusion region of an MOS transistor, and together with said resistor and said high impurity concentration layer constitutes an inverter circuit.

* * * * *